US007184359B1

(12) United States Patent
Bridgewater et al.

(10) Patent No.: US 7,184,359 B1
(45) Date of Patent: Feb. 27, 2007

(54) SYSTEM AND METHOD FOR STAGING CONCURRENT ACCESSES TO A MEMORY ADDRESS LOCATION VIA A SINGLE PORT USING A HIGH SPEED SAMPLING CLOCK

(75) Inventors: Walter F. Bridgewater, San Jose, CA (US); Anup Nayak, Fremont, CA (US); Dimitris C. Pantelakis, Austin, TX (US); S. Babar Raza, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 4 days.

(21) Appl. No.: 11/003,292

(22) Filed: Dec. 3, 2004

Related U.S. Application Data

(60) Provisional application No. 60/531,835, filed on Dec. 23, 2003.

(51) Int. Cl.
*G11C 8/00* (2006.01)
(52) U.S. Cl. .................. 365/233; 365/154; 365/230.05
(58) Field of Classification Search ................ 365/233, 365/154, 230.05; 711/148, 149
See application file for complete search history.

(56) References Cited

U.S. PATENT DOCUMENTS

| 6,108,756 | A  | * | 8/2000 | Miller et al. ................. 711/148 |
| 6,388,939 | B1 | * | 5/2002 | Manapat et al. ....... 365/230.05 |
| 6,532,524 | B1 |   | 3/2003 | Fan et al. |
| 6,654,275 | B2 | * | 11/2003 | Forbes ........................ 365/154 |
| 6,934,816 | B2 | * | 8/2005 | Matthews et al. .......... 711/149 |

OTHER PUBLICATIONS

Baumann et al., "The Most Commonly Asked Questions about Asynchronous Dual-Port SRAMs," © 2000 Integrated Device Technology, Inc., pp. 1-8.
Brennan, "The Most Commonly Asked Questions about Synchronous Dual-Port SRAMs," © 2000 Integrated Device Technology, Inc., pp. 1-7.
Smith, "Synchronous Dual-Port Static RAMs for DSP and Communication Applications," © 2000 Integrated Device Technology, Inc., pp. 1-9.
"Understanding Asynchronous Dual-Port RAMs," © 1997 Cypress Semiconductor Corp., pp. 1-12.
"Understanding Synchronous Dual-Ports," © 1998 Cypress Semiconductor Corp, pp. 1-7.

* cited by examiner

*Primary Examiner*—Hoai V. Ho
(74) *Attorney, Agent, or Firm*—Kevin L. Daffer; Daffer McDaniel, LLP

(57) ABSTRACT

A memory device, apparatus and method are provided for accessing memory cells. The device, apparatus, and method allow two or more electronic subsystems with corresponding external ports to access a single array of memory elements via a single internal port. Address, data, and control signals from each of the external ports are multiplexed onto the word line drivers and de-multiplexed from the sense amplifiers. Multiplexing and de-multiplexing operations are sequenced based on a state machine that receives synchronized signals from the external port. The synchronized signal can be clock signals that are synchronized to a high-speed sampling clock. Synchronization and sequencing functions can occur over a relatively few number of cycles of the high-speed sampling clock to minimize the time for resolving access conflicts, thereby maximizing the number of external ports which can access the internal port of the array.

9 Claims, 9 Drawing Sheets

SYSTEM AND METHOD FOR STAGING CONCURRENT ACCESSES TO A MEMORY ADDRESS LOCATION VIA A SINGLE PORT USING A HIGH SPEED SAMPLING CLOCK

PRIORITY APPLICATION

This application claims priority to Provisional Application No. 60/531,835 entitled "Multi-Port Memory Architecture," filed Dec. 23, 2003.

BACKGROUND OF THE INVENTION

1. Field of the Invention

This invention relates to semiconductor memory and, more particularly, to a memory that appears to digital subsystems external to the memory as a dual port memory yet all accesses to the memory array occur through a single port using a synchronizer and sequencer to properly time accesses that occur at finer timing granularity using a high speed sampling clock.

2. Description of the Related Art

The following descriptions and examples are not admitted to be prior art or conventional by virtue of their inclusion within this section.

Most computing systems consist of four functional blocks: a microprocessor (or CPU), memory, input/output (I/O) interface, and an I/O device. The microprocessor is typically interconnected to the memory and the I/O interface via an address bus, data bus, and control lines. The address bus provides a path in which the microprocessor can select certain storage locations in which data is stored. The data bus provides a path over which data is transferred between the microprocessor, memory, and the I/O interface.

Memory to which the microprocessor is coupled is typically referred to as semiconductor memory. Semiconductor memory, as opposed to disk storage devices such as magnetic disks, optical disks, and magneto-optical disks, are coupled closer to the microprocessor and can read data and write data faster than the magnetic or optical heads typically associated with disk storage devices.

The major forms of semiconductor memory include random access memory (DRAM and SRAM), non-volatile programmable memory (PROM, EEPROM, and EPROM), and read-only memory (ROM). The various forms of semiconductor memory involve storage cells arranged in multiple rows and columns, which form an array. Writing to or reading from the array in random fashion is referred to as accessing a random access memory or RAM. While DRAMs enjoy a denser array of cells, SRAMs can be written to and read from (i.e., accessed) faster than DRAMs.

There may be instances in which two or more microprocessors or other such electronic subsystems present addresses and data to the semiconductor memory at the same time or at different times. The electronic subsystems and semiconductor memory can operate at the same clock rate and thus synchronous to each other, or at different clock rates and thus asynchronous to each other. If, for example, two digital subsystems share the same semiconductor memory, such as RAM, each subsystem can access the RAM half the time, assuming the subsystems are clocked synchronous to each other. The limitation of a subsystem accessing the semiconductor memory on every other cycle becomes problematic given the difficulties with interleaving transactions between subsystems. Resulting there from, dual-port or multi-port RAMs became popular. For example, dual-port RAMs do not generally have restrictions regarding accesses between the two ports, and each subsystem can be operating at different clock rates (i.e., asynchronous to each other).

Multi-port memory allows each subsystem access to the array through its dedicated port. Address, data, and control signals from that subsystem arrive at the dedicated port for each subsystem to allow two or more subsystems access to the array at the same time. A problem occurs, however, whenever two or more subsystems access the same addressable location at the same time and, specifically, whenever those accesses involve a write operation. For example, if a first subsystem attempts a write access to the same location as a second subsystem, then a conflict can occur. The same is true if a first subsystem attempts a write access and a second subsystem attempts a read access to the same location. Proper timing of the multiple write accesses or multiple read/write accesses must be determined, and a convention set to guarantee data integrity. While multi-port memories beneficially offer simultaneous access to different portions of memory or read accesses to the same portion, multi-port memories remain restrictive when a read/write or write/write access occurs to the same memory location.

It would be desirable to maintain some of the operational efficiencies of a dual-port or multi-port memory. It would be further desirable to implement the multi-port operational efficiencies within an array of storage cells that are accessed from only a single port. An additional benefit of using a single-port array with the operational characteristics of a multi-port array is further compounded if the improved single-port array can perform address decoding concurrent with the staging of accesses to the array. Staging those accesses can desirably occur by determining time differences between transitions of clocking signals which form the corresponding accesses, and then performing the accesses based on those time differences or according to a predetermined convention or rule if the clock differences are substantially zero.

SUMMARY OF THE INVENTION

The problems outlined above are in large part solved by an improved semiconductor memory device and circuitry for accessing the memory device. As known herein, the term "access" or "accessing" refers to a read or write operation to an array of memory cells. The array of memory cells form a RAM. According to a preferred embodiment, the RAM is a static RAM (SRAM). It is understood, however, that the RAM can also be dynamic RAM (DRAM). Although each electronic subsystem can have a respective address bus, data bus, and control lines, the array of memory cells hereof are accessed by only a single set of address lines (i.e., address bus), data lines (i.e., data bus), and control signals. Accordingly, the present memory device is referred to as a single-port memory device or single-port RAM.

The mechanism by which accesses from two or more subsystems, each having an "external port" are synchronized and sequenced to a single "internal port" that forms a part of and thus is internal to the memory device involves a staging circuit. The staging circuit preferably comprises a synchronizer and a sequencer. For example, the synchronizer is configured to sample a pair of clock signals associated with a pair of accesses to the memory cells via the external ports during transitions of a sampling clock signal. The sampling clock signal is alternatively referred to as a high-speed clock signal, in that the sampling clock signal transitions faster than any of the clock signals at which the address, data, and control signals of the external ports from which the subsystems are synchronized. The sampling clock is preferably 10–100 times faster than either of the pair of clock signals. The sampling clock signal can either be derived internal to the synchronizer from possibly an internal inverter ring oscillator, or one of the pair of clock signals, or the sampling clock signal can be derived external from the synchronizer using, for example, a crystal resonator, a phase-locked loop (PLL), and/or a frequency divider network.

In addition to the synchronizer, the staging circuit can also include a sequencer. The sequencer can be configured as a state machine that receives the sampled transitions of the clock signal synchronized to the sampling clock signal, to determine which transition of the pair of clock signals should come first in the access sequence. Regardless of whether accesses occur to the same memory location and whether those accesses are read/write or write/write at substantially the same time, the sequencer will determine which access should traverse the single port first. The synchronizer thereby can discern relatively minimal time differences between rising (or falling) edges of the externally-derived clock signals using the high sample rate of the sampling clock. The higher the sample rate, the less likely conflicts would arise that would pose transitions of the clock signals at the same time. However, even if the sampled clock signals occur at the same time (i.e., within one cycle of the sampling clock signal), a predetermined set of rules will govern which clock signal and thus which access should be passed through the single port first. The same rule will thereby drive the state machine to parse all concurrent, sampled clock signals in parallel so that the arbitration time is minimal to thereby dedicate more of the cycle time to accesses corresponding to each subsystem access.

BRIEF DESCRIPTION OF THE DRAWINGS

Other objects and advantages of the invention will become apparent upon reading the following detailed description and upon reference to the accompanying drawings in which.

Figure 1:
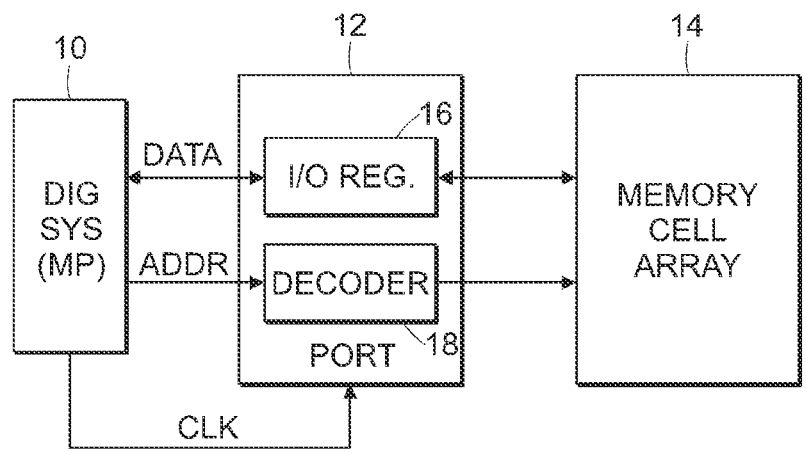
FIG. 1 is a block diagram of a digital subsystem operably coupled to a single port semiconductor memory.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates an electronic subsystem 10 connected to a single port 12 of an array of memory cells 14. The combination of port 12 and array 14 can thereby form a single-port memory, where each cell is preferably a RAM cell. Port 12 preferably receives and sends data from and to system 10, as well as receives an address from system 10. The data and address signal is preferably synchronized to a clock signal, and the clock signal is used to buffer, through an input/output register 16, the input and output of data to and from array 14. The clock signal can also synchronize the decoder 18 functionality of decoding relatively few lines of address across all word lines (rows) of array 14. FIG. 1 thereby illustrates a single-port memory that receives and sends data addressed to a particular location at transitions of the clock signal.

Figure 2:
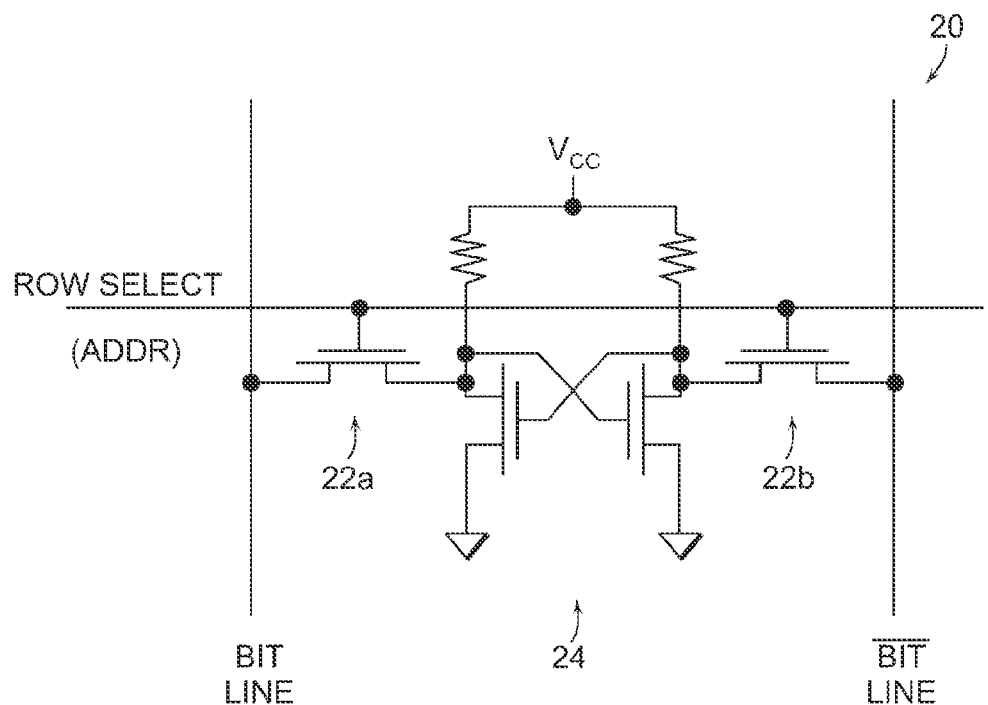
FIG. 2 is a circuit schematic of a memory cell of the single port semiconductor memory of FIG. 1.

FIG. 2 illustrates one example of a single cell 20 within the cell array 14 (FIG. 1). Cell 20 can be a static RAM cell as shown with a pair of access transistors 22*a* and 22*b* that access the true and complementary bit lines whenever the address line is strobed. Coupled between the pair of access transistors 22 is a latch 24. Latch 24 can be configured in numerous ways, one of which is a pair of resistors coupled in series to a pair of cross-coupled transistors, and each series-coupled resistor and cross-coupled transistor is coupled between a power supply and ground. The cross-coupled transistors thereby store a true and complementary logic value on each of the access transistors as the true and complementary bit line values. By strobing an address line, values placed on the bit line can be written to latch 24 or values within latch 24 can be read from the latch onto the bit line, depending on whether the particular access is a write access or a read access.

Figure 3:
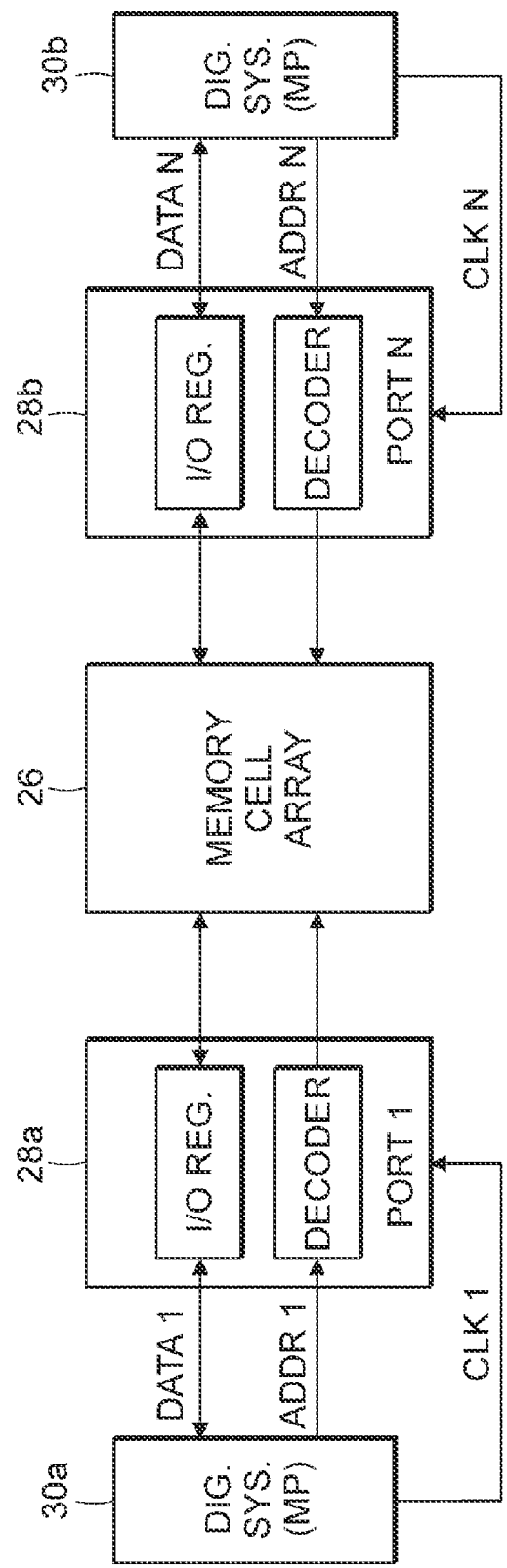
FIG. 3 is a block diagram of at least two digital subsystems operable coupled to a multi port semiconductor memory.

FIG. 3 illustrates a single memory cell array 26 coupled to receive accesses from each of the multiple ports 28*a* and 28*b*. For sake of brevity and clarity in the drawings, only two ports are shown for a multi-port memory. However, it is understood that FIG. 3 can represent either a dual-port memory or a multi-port memory comprising three or more ports. Similar to FIG. 1, each port includes a bidirectional data buffer, and an address decoder coupled between the electronic subsystems 30*a* and 30*b* and the single memory array 26. Each of the multi-ports thereby operate similar to the single-port design of FIG. 1, however, memory array 26 can accommodate two or more read or write accesses. If both ports in a dual-port memory (or RAM) read the same location at the same time, no conflict would occur. However, if one port performs a read operation and the other port performs a write operation to the same location, then arbitration will be needed to prioritize either the reading or the writing port. If, for example, the losing port is attempting to write data, the write access can be inhibited so that the data in memory is first read and, thus, not corrupted with new data.

As described herein below, a busy flag can be asserted to the losing port to inhibit the write operation in this example. If both ports incur a write access to the same location, arbitration is also needed by asserting the busy flag to the losing port to inhibit this port from writing until the winning port performs its write access. Thus, dual-port or multi-port memory architecture requires arbitration logic to resolve conflicts that would occur if one port performs a reading operation and another port performs a writing operation, or both ports perform a writing operation to the same location. In addition to the arbitration logic, each cell within array 26 must be modified as shown in FIG. 4.

Figure 4:
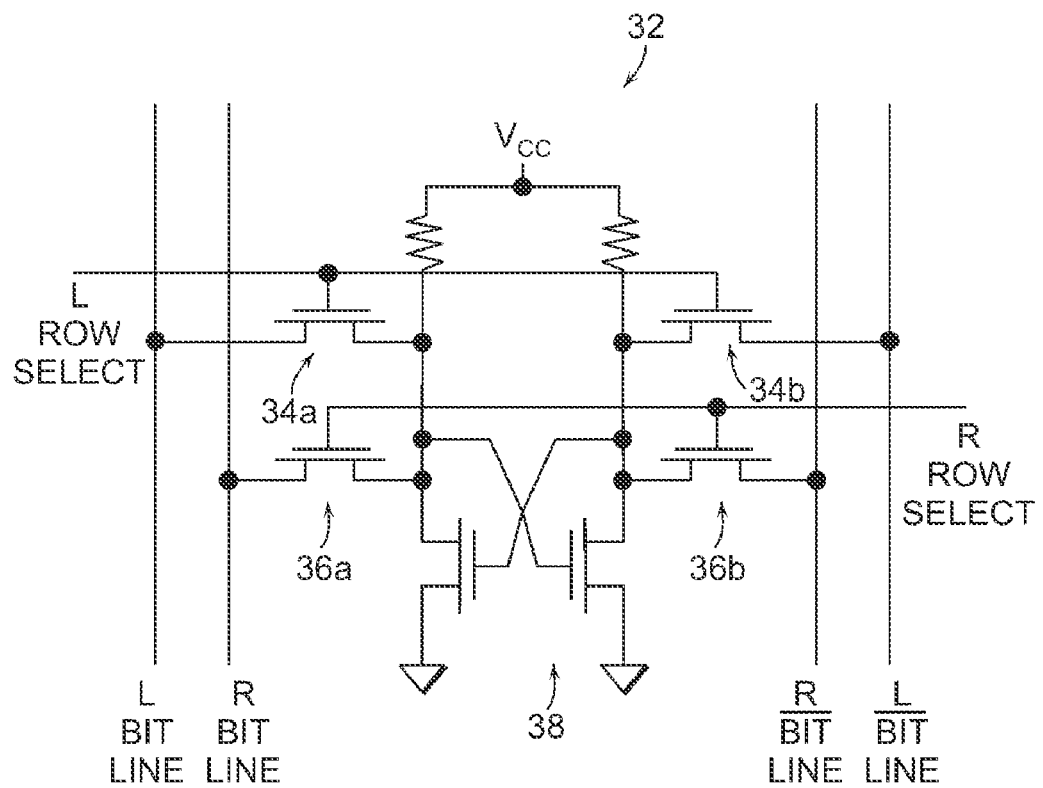
FIG. 4 is a circuit schematic of a memory cell of a dual port semiconductor memory.

Cell 32 of FIG. 4 indicates that for each cell, an additional pair of access transistors are needed: a first pair of access transistors 34a and 34b are needed for the left port address and bit lines, and a second pair of access transistors 36a and 36b are needed for the right port address and bit lines. Even though memory cell 32 involves only a single latch 38, an additional pair of access transistors is needed for each added port. For example, if there are four ports associated with an array, each cell would require four pairs of access transistors. The added pairs of access transistors lower the overall density of each cell. Moreover, if instead of pull-up resistors, p-channel transistors are used, then each cell can have four cross-coupled transistors and a pair of transistors corresponding to each port to make the overall cell size considerably large. As the number of cells increase within the array, any transistor added to the array will substantially increase the overall size of the array and deplete the chip from real estate that might be used for non-memory functions. A single-port design thereby has no more than four transistors if resistor pull-up architecture is used, or no more than six transistors if resistor pull-ups are not used regardless of whether two, three, or substantially more than three separate and independent clocking signals with address and data lines are present from disparate multiple electronic subsystems.

An electronic subsystem can either access the memory cell array by performing a write operation or a read operation. If two or more electronic subsystems perform a write access or a read/write access to the same addressable memory location at approximately the same time, a conflict can arise. In conventional systems, arbitration must then be performed and ownership of the memory cell array is assigned to the winner of that arbitration. An active low logic level on a BUSY signal notifies the losing subsystem of the arbitration result. The losing subsystem or subsystem which issues the losing access will be inhibited from writing to or reading from the particular conflicting addressable location until the winning subsystem access has completed.

There are many types of arbitration available and generally include some form of address comparison to determine if there is an address match between an address sourced from one subsystem and an address sourced from another subsystem. Since the address from each subsystem must be latched into the target device, each address has a corresponding clock signal. A transition on the clock signals will thereby signify whether the address is valid or invalid. Assuming the chip select or chip enable (CE) signal from both subsystem are active, the result of the address comparison is combined with the chip select value to determine, for example, which address was asserted first.

Figure 5:
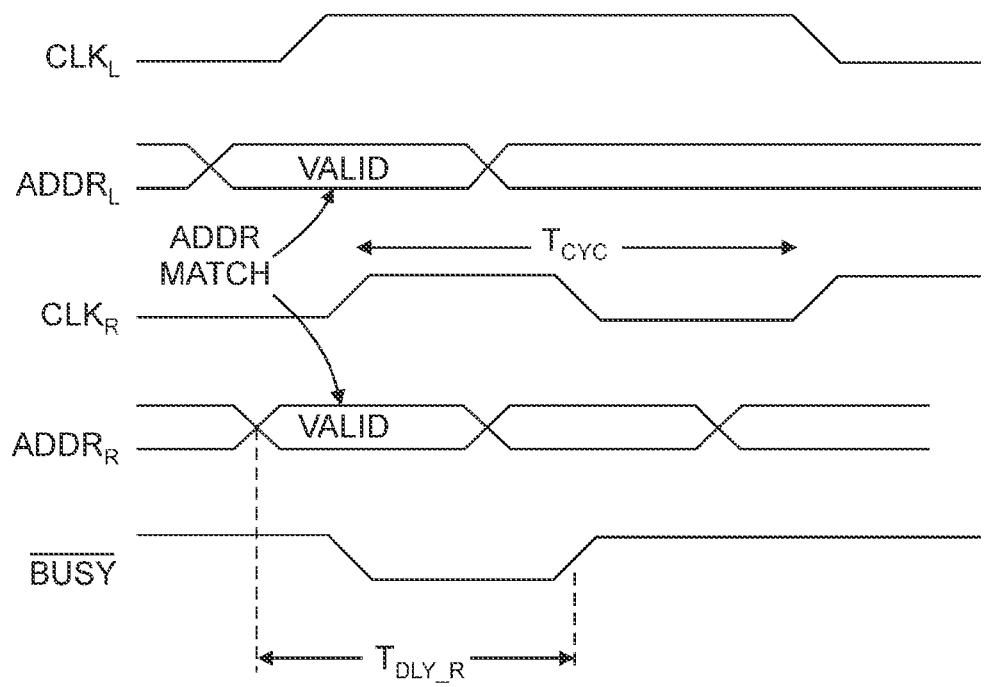
FIG. 5 is a timing diagram of the operation of arbitration logic used for resolving conflicts caused by write or write/read accesses from two digital subsystems to the same memory address.

Using a simplified two-subsystem arbitration mechanism, FIG. 5 illustrates a valid address arriving from the left subsystem (ADDR_L) during the transition of the left subsystem external clock (CLK_L). The arbitration logic will also receive the valid address of the right subsystem (ADDR_R) at the transition of the external clock from the right subsystem (CLK_R). In order to perform the arbitration logic, a certain amount of delay is associated with the comparison of the addresses to determine whether the valid addresses match. If so, the next determination is whether the addresses are write addresses, where potential for conflict might arise, or whether the pair of accesses involve a write access and a read access. If, indeed, a conflict is determined and the addresses yield a match, the arbitration logic will determine which access was first, and delay the losing access as shown by $T_{DLY\_R}$.

Figure 6:
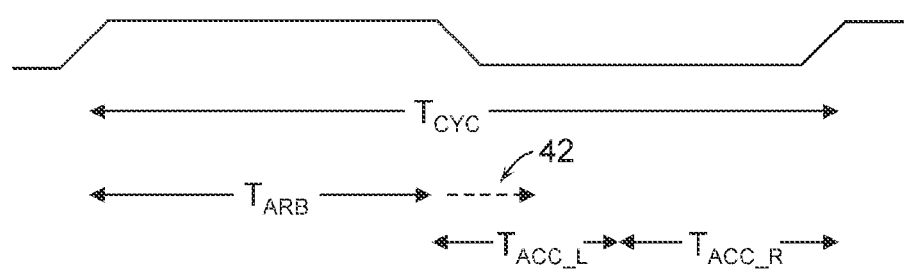
FIG. 6 is a timing diagram of time for performing arbitration scaled to the number of digital subsystems accessing the same memory address, and the ensuring accesses performed in an order resolved by the arbiter.

Determination of a conflict by examining for matching addresses and for write/write and read/write accesses takes a significant amount of cycle time as shown by a comparison of $T_{ARB}$ and $T_{CYC}$ in FIG. 6. As the arbitration time increases due to an increase in the number of subsystems accessing the memory array, $T_{ARB}$ will consume more of the cycle time $T_{CYC}$ as shown by the dashed line 42. As more of the cycle time is consumed by arbitration, there is less time available for accessing memory by the subsystems. For example, if there are more than three subsystems, then the arbitration time needed to arbitrate between the three conflicting accesses may leave insufficient time for the actual accesses being performed in sequence. As used herein, the term "access time" is, for example, the time between when an address is placed on the address bus and the addressed data appears on the data bus for a read operation. Access time often gauges the speed of the memory array, which is the time from assertion of a valid address to valid data (read operation), or the completion of the write into the array (write operation). The time from one memory access to the next is often referred to as the "cycle time." For SRAM, cycle time is generally equal to the number of access times of corresponding subsystems and the arbitration time—assuming the arbitration time is not unduly long and/or the cycle time is long enough to accommodate a long arbitration time and multiple accesses performed in series.

Figure 7:
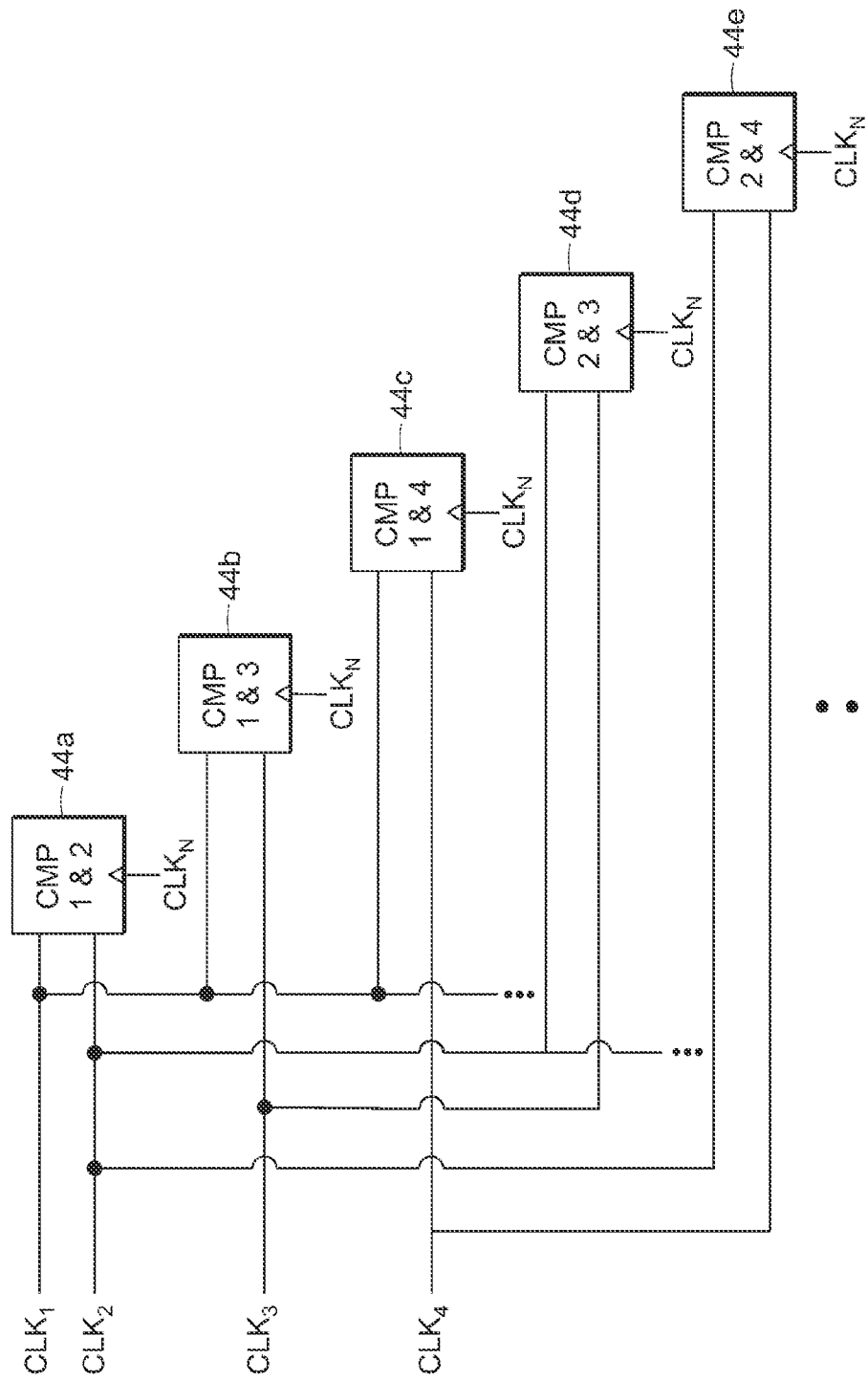
FIG. 7 is a simplified block diagram of an arbiter for resolving access conflicts.

As shown in FIG. 7, the reason the arbitration time $T_{ARB}$ can be rather lengthy is readily apparent if the addresses or clock signals associated with those addresses arise from multiple disparate subsystems. In FIG. 7, four subsystems with associated clock signals and corresponding addresses must be compared to determine which one arrived earliest and, thus, is the winner of arbitration. For only four subsystems, six comparisons are needed with only five of those shown as items 44a, 44b, 44c, 44d, and 44e. The time needed to perform the comparison relative to a clock edge of a clocking signal $CLK_N$ can be rather lengthy. This is particularly acute if the cycle time is relatively short, thereby straining the number of possible access times performed in series with an unduly arbitration time.

Memories that are designed to receive address, data, and control signals that are independent of each other and from multiple subsystems usually serve as packet memory, transient buffers, virtual output queues, and inter-processor memory. Packet memory is used to store a packet until a transmission link is free. Transient buffers are used as temporary storage places for packets while the header is being manipulated and changed. A disadvantage of conventional multi-port designs that use dedicated ports for the address, data, and control signals of each subsystem is that these types of designs are not optimal when more than two electronic subsystems are involved.

As shown in FIGS. 5–7, unduly long arbitration whenever more than two subsystems are utilized will deplete available time for access. Moreover, when dedicated ports are available to access the array, the array must be modified to include a pair of access transistors for each port as shown by a comparison of FIGS. 2 and 4. Replication of the read and write path for the entire memory array leads to larger die area and less area available to non-memory functions to limit the scalability of multi-port memories. Whenever conflicts would arise, the worst-case cycle time for each of the external accesses, therefore, becomes the sum of the arbitration time $T_{ARB}$ and the product of the number of subsystems times their respective access time $T_{ACC}$. As shown in FIG. 7, an increase in the number of subsystems increases exponentially the arbitration time. Hence, such architectures do not scale very well to large number of subsystems accessing the array.

Figure 8:
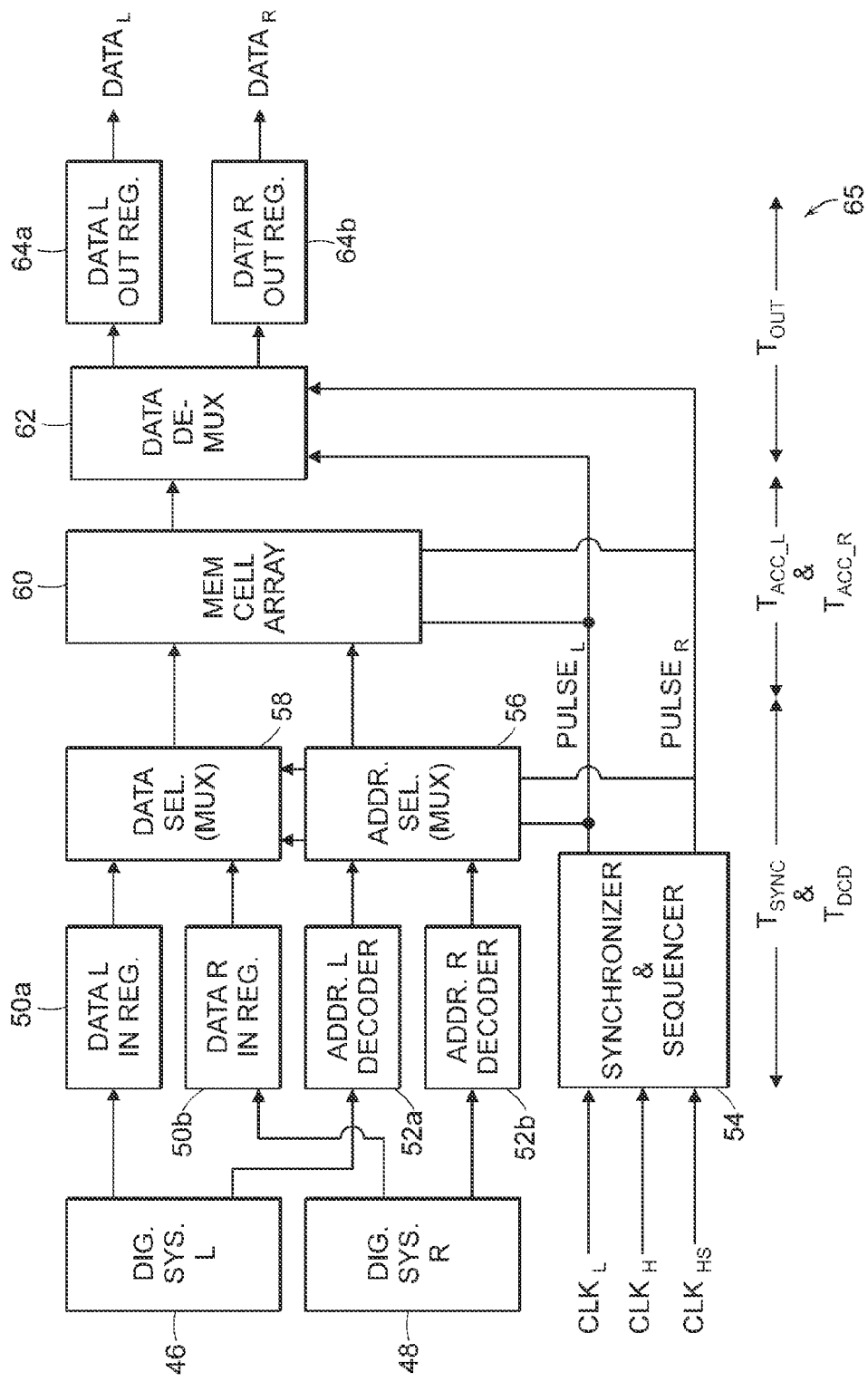
FIG. 8 is a block diagram of an improved memory access architecture for synchronizing the rising edges of clock signals from two or more digital subsystems and sequencing accesses to the memory based on the timing of the synchronized rising edges.

FIG. 8 illustrates an improved architecture that allows multiple subsystems, each having address/data/control lines associated with a port is external to the memory, and thus is referred to as an "external port." The external port of each subsystem can be combined to a single port for accessing the memory by multiple subsystems, and thus the single port of the memory is referred to as an "internal port." For brevity and clarity in the drawing, only two subsystems are shown; however, it is understood that the present architecture can accommodate more than two subsystems. The two subsystems are shown as left and right subsystems 46 and 48, respectively. The left subsystem 46 can forward data into a register 50a, and an address into a decoder 52a. Likewise, data from right subsystem 48 can be sent into a register 50b, and an address into a decoder 52b. As the data is being temporarily held within the registers 50 and the address is being decoded, a staging circuit 54 is receiving clock signals $CLK_L$, $CLK_R$ at which the address and data of the left and right subsystems, respectively, are synchronized. A high-speed sampling clock ($CLK_{HS}$) can also be received by staging circuit 54. As will be described in more detail in reference to FIG. 9, staging circuit 54 includes both a synchronizer and a sequencer.

The synchronizer synchronizes the clock signals to the high-speed sampling clock transition edges. The sequencer will then take the synchronized rising (or falling) edge of each clock signal and, based on the timing disparity of those edges, produce a pulse ($PULSE_L$) corresponding to the left clock signal and a pulse ($PULSE_R$) corresponding to the right clock signal. The pulse signals and, particularly, the timing of the pulse signals dictate when the accesses are to occur for the left and right subsystems. The pulse signals are sent to an address select circuit 56 and to a data select circuit 58. The select circuits 56 and 58 function as multiplexers. Depending on which pulse occurs first, the multiplexer function will choose the decoded address from either the left or right decoder, or the data temporarily stored in the particular left or right register. For example, if the left pulse occurs first, then data from register 50a and decoded address from decoder 52a are selected first. Sometime thereafter, preferably after the left pulse has substantially terminated, the right pulse will select data from register 50b and decoded address from decoder 52b. Obviously, for a read operation, only the addresses are being selected. However, for a write operation, both data and addresses are being selected between the signal sent from the left and right subsystems. Again, however, while FIG. 8 example only shows two subsystems, staging circuit 54 is contemplated as being able to synchronize clock signals from more than two subsystems, sequence access pulses based on which of the synchronized clock signals transitions first, and select addresses and/or data from two or more subsystems to be forwarded to the memory cell array 60.

As shown in timeline 65, the staging function ($T_{SYNC}$), which includes the synchronizer and the sequencer functionality is performed in parallel with the address decoding and data storage ($T_{DCD}$) within the registers. The time savings of doing both operations in parallel allow the multiplexer to directly send a previously decoded address to the appropriate rows of the array without having to perform a decoding operation post-multiplexing. The more functions that can be performed within the staging timeframe allows for more time to actually perform the access. As shown, once the staging has occurred and the addresses are decoded, they are then presented to the array in sequence ($T_{ACC\_L}$, $T_{ACC\_R}$) based on the timing of the left and right pulses. After the accesses are completed one after the other, the first access is output as data into a data de-multiplexer 62 and then, based on the timing of the pulses, to the appropriate output register 64a or 64b. For example, if the left pulse occurs first, then access occurs first from the left subsystem onto array 60, and data of that access is placed into the de-multiplexer 62 which will then select that data as being attributed to the left pulse (thus, the left subsystem) for output to the left register 64a in lieu of the right register 64b.

Figure 9:
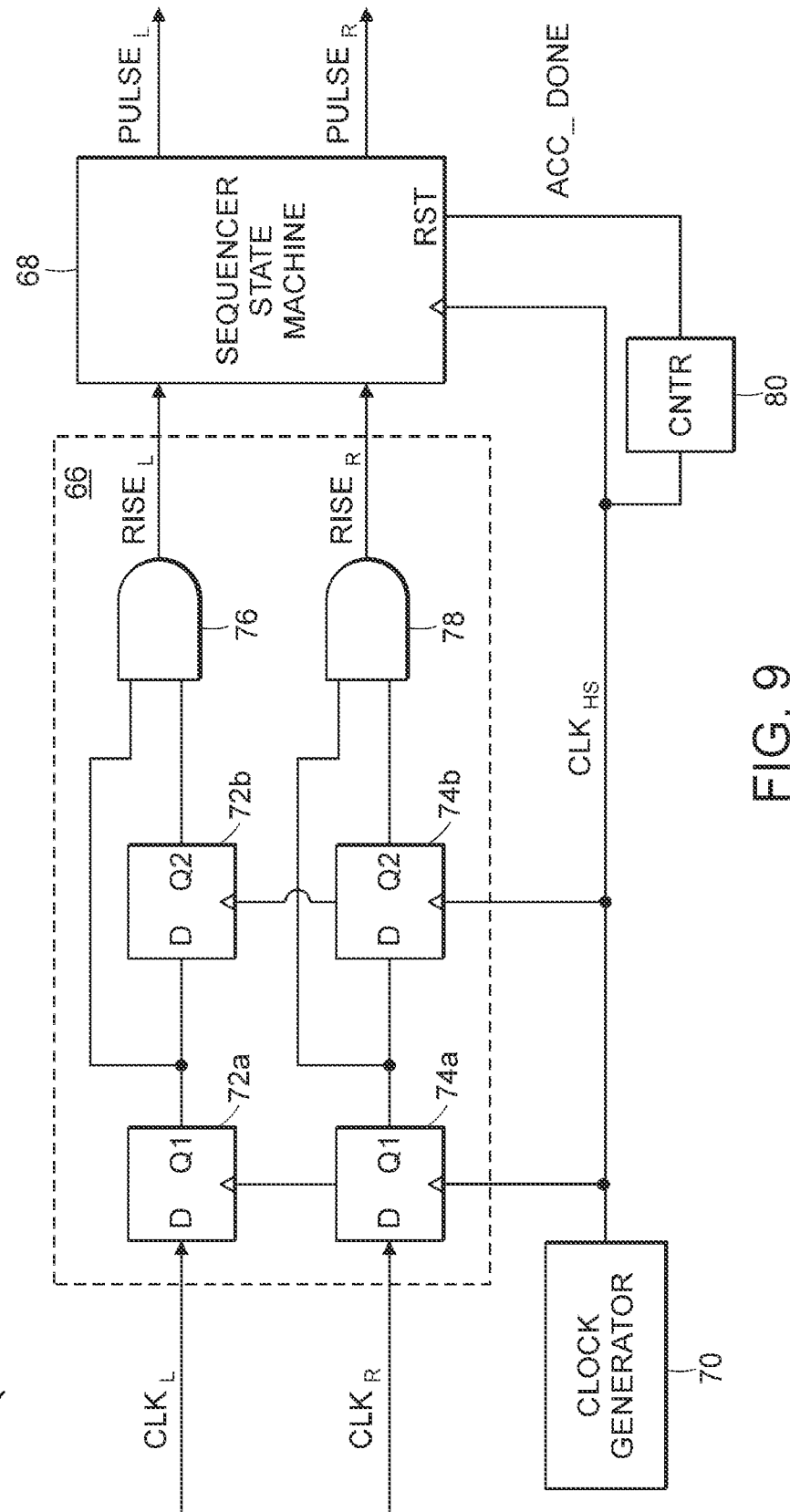
FIG. 9 is a detailed block diagram of the synchronizer and sequencer block of FIG. 8.

FIG. 9 illustrates in more detail staging circuit 54. As described earlier, staging circuit 54 includes a synchronizer 66 and a sequencer state machine 68. Synchronizer 66 synchronizes the left and right clock signal transitions of a high-speed sampling clock generated from a clock generator 70. Clock generator 70 can either derive the high-speed clock internally from one or more of the pair of clock signals, or can generate the high-speed clock externally from, for example, a crystal oscillator, a voltage-controlled oscillator, or any other oscillation mechanism, possibly using a clock divider and a phase-locked loop. The high-speed clock $CLK_{HS}$ is used to latch in the pair of clock signals into registers or D-type flip-flops (72a/b, 74a/b) coupled in series.

Figure 10:
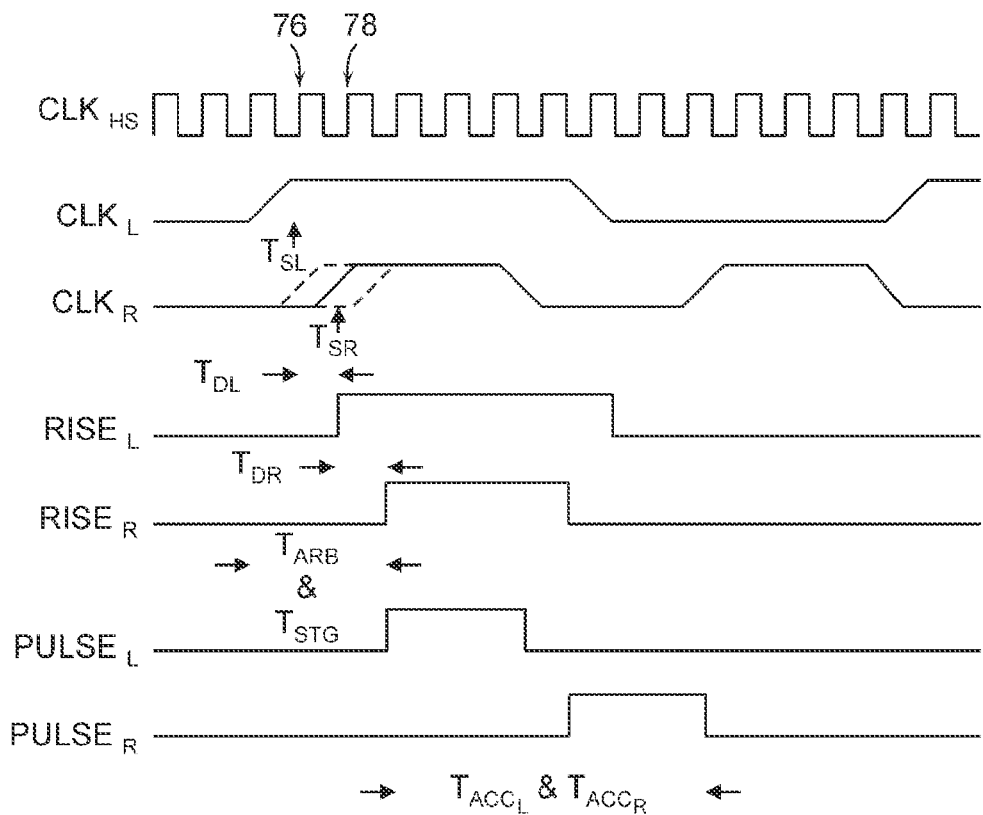
FIG. 10 is a timing diagram of the synchronizer and sequencer operation.

Description of the functionality of synchronizer 66 is best illustrated in reference to both FIGS. 9 and 10. As either the left or right clock signal rises above a threshold value, the clock signal will be sampled on a transition (shown as the rising edge transition) of the high-speed clock. For example, the left clock signal is sampled at time $T_{SL}$, since the left clock signal does not transition above a threshold value until the rising edge 76. The right clock signal, however, achieves the threshold voltage at the rising edge 78 of the high-speed clock. Thus, the right clock signal is sampled at time $T_{SR}$. Even though the left clock signal is sampled at time $T_{SL}$ and the right clock signal is sampled at time $T_{SR}$, it is not until the next clock cycle that the left and right rise times will occur as shown by delay $T_{DL}$ and $T_{DR}$. This delay is due to the series-connection of two flip-flops 72 and 74 for the pair of clock signals input into a 2-input AND gate pair 76 and 78 to produce the $RISE_L$ and $RISE_R$ outputs.

Approximately one cycle of the high-speed clock subsequent to the left and right rise times, a left and right pulse will appear at the output of state machine 68. As shown in FIG. 10, the arbitration time $T_{ARB}$ and the staging time $T_{STG}$ occur in three cycles or less of the high-speed clock. If the high-speed clock is made extremely fast (i.e., 100 or more times faster than the clock signals), then the arbitration time relative to a clock signal cycle time is extremely short. The arbitration and staging time scales extremely well to more than two subsystems since, regardless of the number of subsystems, the depth of the flip-flops is always two and no more than two for each independent clock signal. By shortening the arbitration and staging times using fast transitions of a relatively high-speed sampling clock, the time left over for accessing the memory array is considerably longer than in conventional architectures. Thus, more than two digital subsystems can be readily accommodated.

Figure 11:
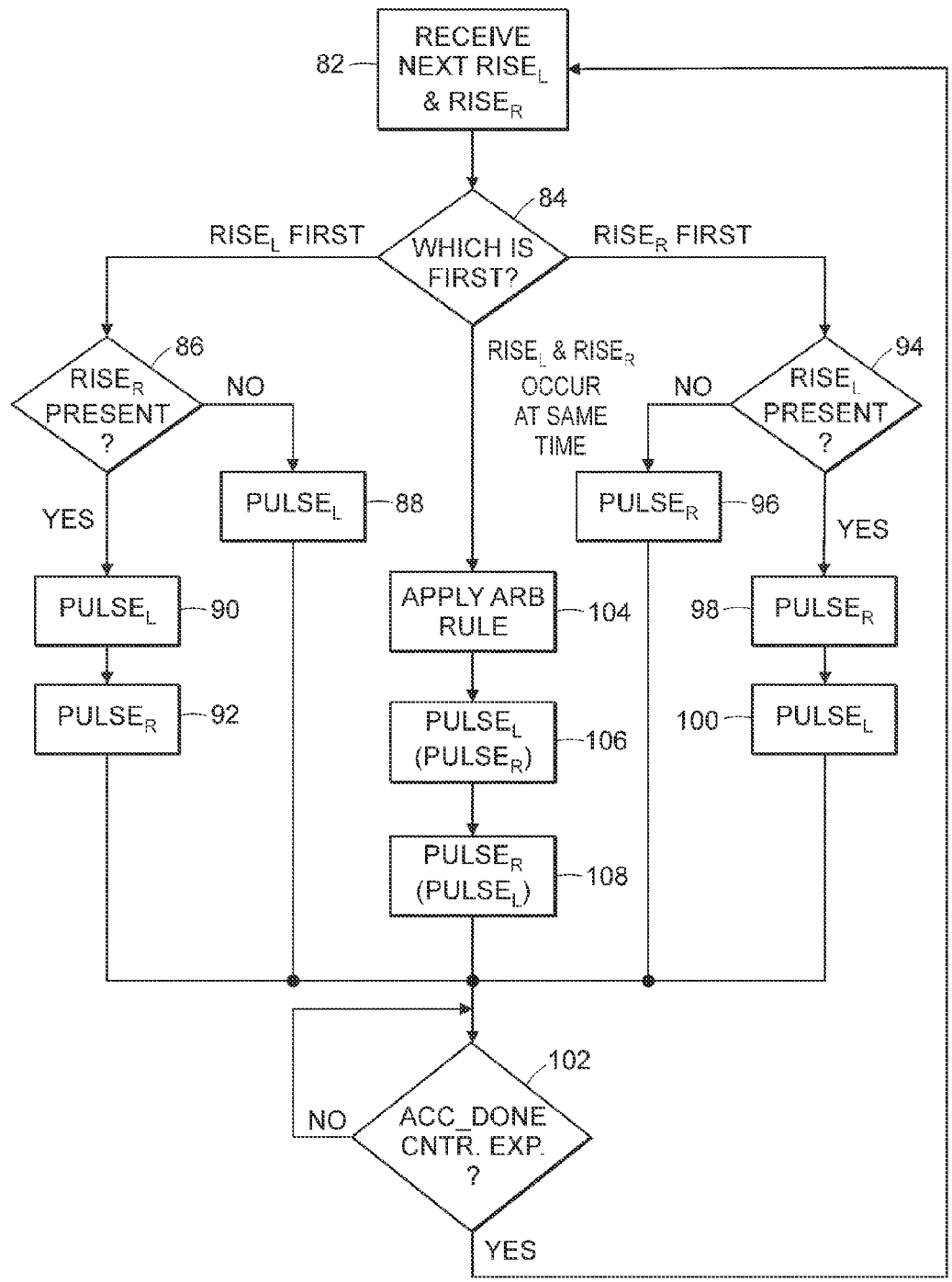
FIG. 11 is a flow diagram of various states of the sequencer state machine of FIG. 9.

The functions and features of the sequencer state machine 68 are best illustrated in reference to FIG. 11. A counter 80 (FIG. 9) may be needed to determine when to reset the state machine in preparation for the next set of rise signals (or accesses). Counter 80 can be designated to count a predetermined number of high speed clock cycles. Once counter 80 achieves a particular count value, then an access done (ACC_DONE) signal can be sent from counter 80 to reset state machine 68.

FIG. 11 illustrates the sequence of operation undertaken by state machine 68 (FIG. 9). Upon receiving the next left and right rise signals 82, a determination must be made by comparing the time differences between the leading edges of those signals. The comparison is performed by a logic comparator to determine which of the rising edges occur first 84. If, for example, the left rising edge occurs first, then a determination must be made whether a subsequent right rising edge is present 86. If not, then it is known that only a left pulse need be asserted 88. If a right rising edge is present, then logic is available to present both the left pulse 90 first followed by the right pulse 92.

Conversely, if it is determined at decision block 84 that the right rising edge occurs first, then a determination must be made whether a subsequent left rising edge is present 94. If not, then it is known that only a right pulse need be asserted 96. If a left rising edge is present, then logic is available to present both the right pulse 98 first followed by the left pulse 100.

Regardless of which rising edge is asserted first, a determination must be performed of the counter count value to determine whether the counter has expired 102. Preferably, the counter will expire after all pulses are asserted. Once the count value has been reached and the ACC_DONE signal is asserted, then the state machine transitions back to state 84 in readiness for the next set of rising edges.

It may be possible that the synchronized rising edges may occur at the same time (i.e., within one clock cycle of the high-speed clock). If so, then decision block 84 will yield a need to apply a predefined rule 104 to grant mastership of one pulse before another. The rule can be programmed within configuration registers associated with the state machine so that, for example, the left pulse 106 is always presented before the right pulse 108. Alternatively, the configuration register can be programmed to always present the right pulse before the left pulse, as shown in the parenthetical of 106 and 108.

Regardless of how the state machine decides to apply the rule and regardless of whether the left or right rising edges appear first, the present architecture, circuit, and method enable a multi-port operation based only on a single port memory array and, particularly, a single port memory cell. The present single port memory thereby provides similar functionality to conventional multi-port memory cells based on multi-port products. Like a conventional dual-port memory, the present memory provides word level access granularity and independent clock domains accessing the array. The present memory architecture thereby multiplexes two ports accessing of a single core. Since the two ports operate in independent clock domains, i.e., with no timing relationship to each other, the scheduling of the core accesses from the two ports involves a central synchronizer and sequencer that naturally performs the arbitration function if any conflicts arise.

Scheduling performed in the staging circuit occurs in parallel with addressed decoding to remove the timing overhead if such operations were to be performed in sequence. Address and data inputs are internally multiplexed before accessing a single port memory core, i.e., a memory core involving a cell array with only one set of address, data, and control lines coupled thereto. Data output is de-multiplexed after the output from the memory core occurs. The multiplexer circuits for addressing data are physically close to the memory core and thus forms the internal port of the memory as near to the word line drivers as possible.

The high-speed clock thereby samples the clock inputs of what can be considered external ports, but certainly not the single internal port placed immediately adjacent to the cell array. When a rising edge is detected on one or more ports (i.e., external ports), the synchronizer logic gates can predetermine the order of accesses to the single internal port memory core. The time taken to complete the sequencing task is relatively constant with respect to the number of external ports. Therefore, the present architecture scales very well to a larger number of ports exceeding, for example, two external ports. A single port memory can be accessed by two or more ports with their independent clock domains.

The synchronizer circuit can essentially treat the external port clocks, hereinafter simply "clock signals," as asynchronous signals and synchronizes them to the high-speed clock that can be generated externally or internally. The sequencer is a synchronous state machine clocked by the high-speed clock. Using this technique, probability of failure due to meta-stability is reduced by registering the external asynchronous signal in the data register and decoder stages. The synchronization may take up to three cycles of the high-speed clock. Once the clock signals are synchronized, read/write access requests (that occur synchronously in the port clock domain) are sampled with the internal high-speed clock and an internal grant pulse signal is generated for each pulse. The clock signals of the external port clocks are used to register the input address/data/control signals and the output data, similar to conventional dual-port designs.

The sequencer state machine receives an input of an access done signal to indicate the completion of the current access operation. Preferably, the access done signal is generated by a counter running on the high-speed clock domain to indicate when a core access is completed. When the core access is granted to either of the external ports associated with the corresponding subsystems, the counter is preset to a value determined during the manufacturing process at sort test and fuse programmed on the part, for example. When the counter counts down to its minimum value (or maximum value), the access done signal is asserted for a clock cycle. Upon receiving the access done signal, core access operation is considered complete for the external port having current access, and the next port access can then be started. Access is granted to the external ports through a single internal port via the $PULSE_L$ and $PULSE_R$ signals.

Unlike a conventional solution, where data may become corrupt whenever two or more memory ports try to access the same address at the same time, and one or more of the ports are writing to that address, at least one advantage of the present architecture, circuit, and system is that the order of the two accesses and, therefore, the final data is always deterministic. In other words, there will always be a predefined amount of time for resolving the conflict in the present solution. A further advantage is that the conflict resolution operation is predetermined and in another embodiment, it can be programmed using configuration registers. Yet another advantage is that the improved solution is physically and architecturally closer to the memory core and duplicates partial address decode for each of the external ports.

By performing address decoding and temporarily storing incoming data in registers, meta-stability and address decode are pre-performed so that the multiplexer selection is placed immediately upon the final word line driver of the array. This will enhance the effective speed of sharing a single port memory between two or more external ports, because part of the delay for the address decoding is performed in parallel on all ports at the same time. Placing the multiplexer selection closer to the memory array also helps the memory core output, since the de-multiplexer can be placed adjacent the array next to the sense amplifier bit line outputs. This allows higher throughput for the single port memory core. The external port count of a multi-port device can be increased while using a single internal port without a corresponding increase in the performance penalty incurred due to arbitration and synchronization. In addition, a predictable synchronization penalty is achieved while maintaining acceptable mean time between failure rates beyond reasonable lifetimes of such products. A further advantage is that the circuitry implementing synchronization, arbitration, and sequencing functions are simplified.

It will be appreciated that in the foregoing description of exemplary embodiments, various features are sometimes grouped together in a single embodiment. This method of disclosure, however, is not to be interpreted as reflecting an intention that all such claimed features require more features than are expressly recited in the corresponding claim. Rather, numerous variations and modifications will become apparent to those skilled in that once the above disclosure is fully appreciated. It is intended that the following claims be interpreted to embrace all such modifications and changes and, accordingly, the specification and drawings are to be regarded in an illustrative rather than a restrictive sense.

What is claimed is:

1. A memory device, comprising:
    an array of memory cells;
    a synchronizer configured to sample a pair of clock signals associated with a pair of accesses to the memory cells during transitions of a sampling clock signal that transitions faster than said pair of clock signals; and
    a sequencer configured to sequence the pair of accesses depending on the relative time difference between the pair of sampled clock signals.

2. The memory device as recited in claim 1, wherein each of the array of memory cells comprise no more than six transistors.

3. The memory device as recited in claim 1, wherein each of the array of memory cells comprise no more than four transistors and two pull-up resistors coupled between a power supply and two of the four transistors cross-coupled to each other.

4. The memory device as recited in claim 1, wherein the synchronizer is configured to sample a transition of the pair of clock signals at a moment in which the transitions of the sampling clock signal occur.

5. The memory device as recited in claim 1, wherein the synchronizer comprises:
    a first pair of latches coupled in series to latch a first one of the pair of clock signals during successive transitions of the sampling clock signal; and
    a first logic gate coupled to the output of the first pair of latches for producing a first rising edge forwarded to the sequencer if the first one of the pair of clock signals is at a logic high voltage value during the successive transitions.

6. The memory device as recited in claim 5, wherein the synchronizer comprises:
    a second pair of latches coupled in series to latch a second one of the pair of clock signals during successive transitions of the sampling clock signal; and
    a second logic gate coupled to the output of the second pair of latches for producing a second rising edge forwarded to the sequencer if the second one of the pair of clock signals is at a logic high voltage value during the successive transitions.

7. The memory device as recited in claim 6, wherein the sequencer allows access to the memory array by the pair of accesses in an order determined by a sequence of the first and second rising edges.

8. The memory device as recited in claim 6, wherein the sequencer allows access to the memory array by the pair of accesses in an order determined by a predetermined rule if the first and second rising edges occur at substantially the same time.

9. The memory device as recited in claim 1, further comprising an address and data path coupled to retain an address and data upon an input to the array of memory cells concurrent with the synchronizer sampling the pair of clock signals and the sequencer sequencing the pair of accesses.

* * * * *